(12) United States Patent
Micovic et al.

(10) Patent No.: US 7,098,490 B2
(45) Date of Patent: Aug. 29, 2006

(54) GAN DHFET

(75) Inventors: Miroslav Micovic, Newbury Park, CA (US); Tahir Hussain, Calabasas, CA (US); Paul Hashimoto, Los Angeles, CA (US); Peter W. Deelman, Calabasas, CA (US)

(73) Assignee: HRL Laboratories, LLC, Malibu, CA (US)

( * ) Notice: Subject to any disclaimer, the term of this patent is extended or adjusted under 35 U.S.C. 154(b) by 39 days.

(21) Appl. No.: 10/832,691

(22) Filed: Apr. 26, 2004

(65) Prior Publication Data

US 2004/0238842 A1 Dec. 2, 2004

Related U.S. Application Data

(60) Provisional application No. 60/475,545, filed on Jun. 2, 2003.

(51) Int. Cl.
*H01L 29/772* (2006.01)
(52) U.S. Cl. .............. 257/200; 257/192; 257/201; 257/E21.395; 257/E21.399
(58) Field of Classification Search ............ 257/192, 257/200–201, E21.395, E21.399
See application file for complete search history.

(56) References Cited

U.S. PATENT DOCUMENTS

| | | | |
|---|---|---|---|
| 4,827,320 A | 5/1989 | Morkoc et al. | 357/22 |
| 5,548,139 A | 8/1996 | Ando | 257/192 |
| 5,929,467 A | 7/1999 | Kawai et al. | 257/192 |
| 6,064,082 A * | 5/2000 | Kawai et al. | 257/192 |
| 6,140,169 A * | 10/2000 | Kawai et al. | 438/197 |
| 6,399,430 B1 | 6/2002 | Morikawa | 438/167 |
| 2004/0029330 A1 | 2/2004 | Hussain et al. | 438/172 |

FOREIGN PATENT DOCUMENTS

JP           10335637 A   *  12/1998

OTHER PUBLICATIONS

Ambacher, O., et al., "Two-Dimensional Electron Gases Induced By Spontaneous and Piezoelectric Polarization Charges in N- and Ga-face AlGaN/GaN Heterostructures," *Journal of Applied Physics*, vol. 85, No. 6, pp. 3222-3233 (Mar. 15, 1999).

Hackenbuchner, S., et al., "Polarization Induced 2D Hole Gas In GaN/AlGaN Heterostructures," *Journal of Crystal Growth*, pp. 1-4 (2000).

Maeda, N., et al., "Enhanced Two-Dimensional Electron Gas Confinement Effect on Transport Properties in ALGaN/InGaN/AlGaN Double-Heterostructures," *NTT Basic Research Laboratories*, pp. 727-731 (1999).

(Continued)

*Primary Examiner*—Allan R. Wilson
(74) *Attorney, Agent, or Firm*—Ladas & Parry LLP

(57) ABSTRACT

The present invention provides a GaN based DHFET that helps confine the 2DEG to the channel layer, and reduces the 2DHG. The present invention provides a GaN DHFET having a channel layer comprising GaN and a buffer layer comprising $Al_xGa_{1-x}N$. The Al content in the buffer layer is specifically chosen based on the thickness of the channel layer using a graph. By choosing the Al content in the buffer layer and thickness of the channel layer in accordance with the graph provided in the present invention, the ability of the buffer layer to help confine the 2DEG to the channel layer is improved.

20 Claims, 8 Drawing Sheets

OTHER PUBLICATIONS

Maeda, N., et al., "Two-Dimensional Electron Gas Transport Properties In An AlGaN/(In)GaN/AlGaN Double-Heterostructure Field Effect Transistors," *NTT Basic Research Labortories*, 6 pages total (1999).

Nguyen, L.D., et al., "50-nm Self-Aligned-Gate Pseudomorphic AlInAs/GaInAs High Electron Mobility Transistors," *IEEE Transactions on Electron Devices*, vol. 39, No. 9, pp. 2007-2014 (Sep. 1992).

\* cited by examiner

Conduction band diagram and structure of
Single Heterojunction GaN HFET

Conduction band diagram of InP DHFET

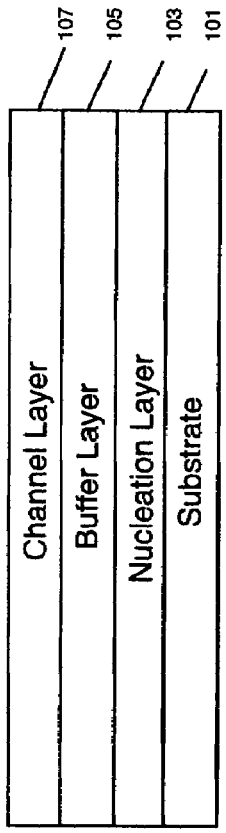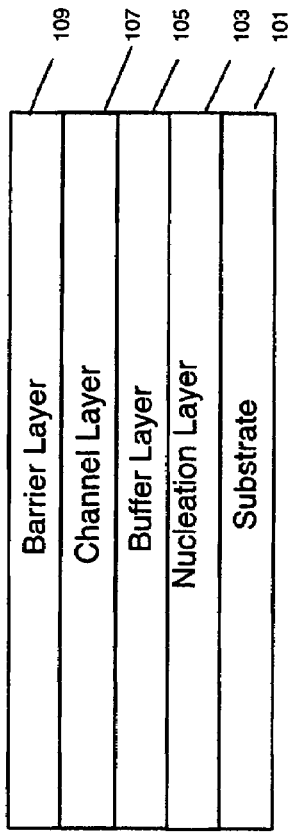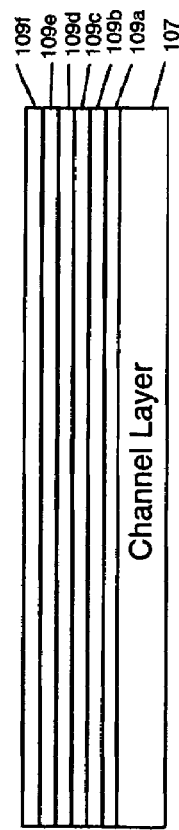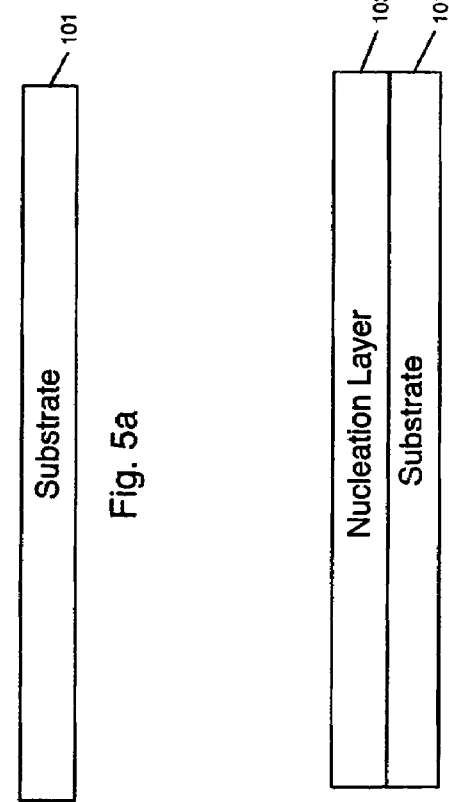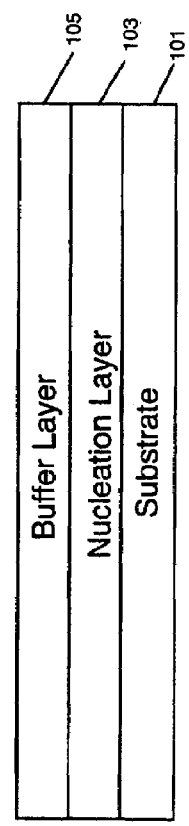

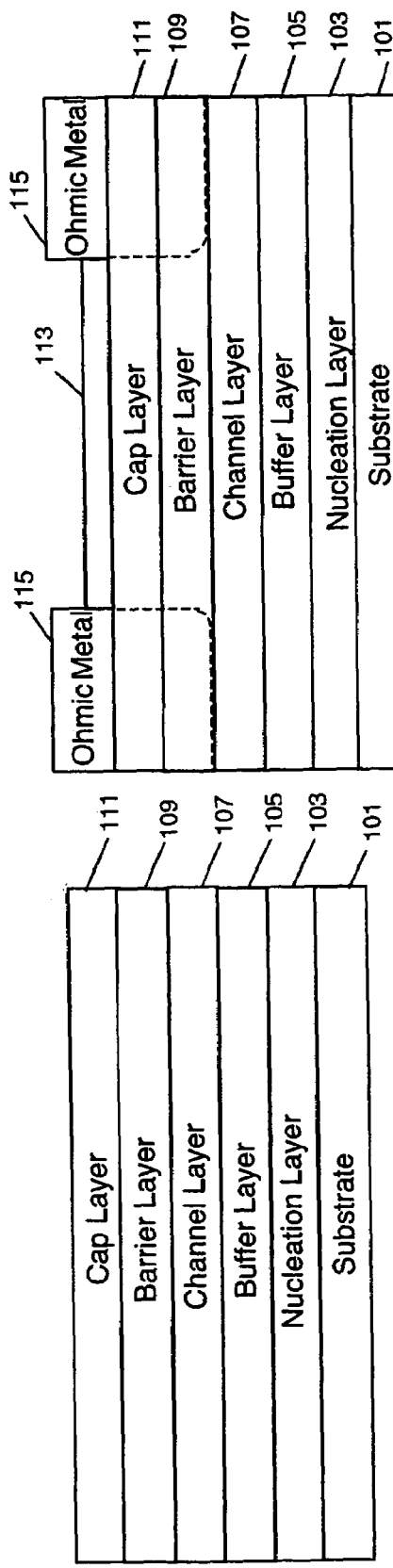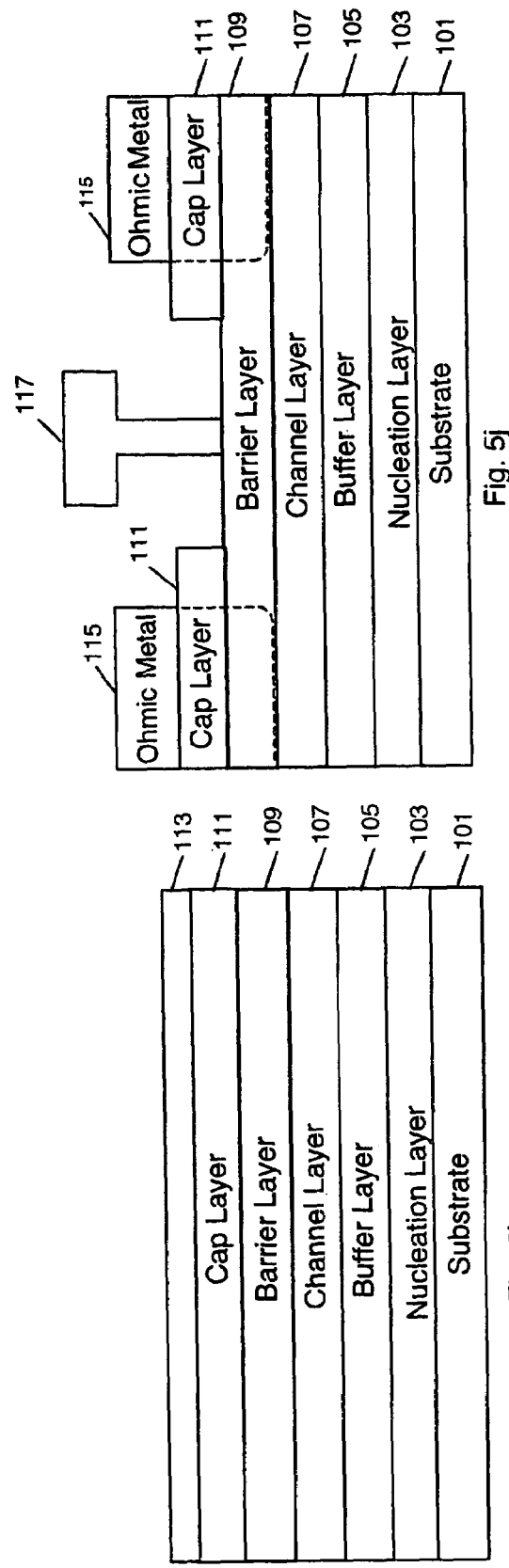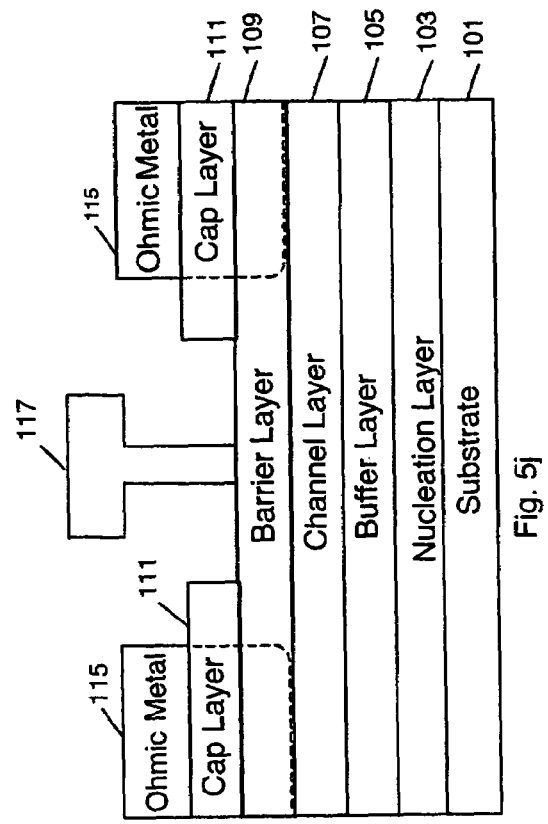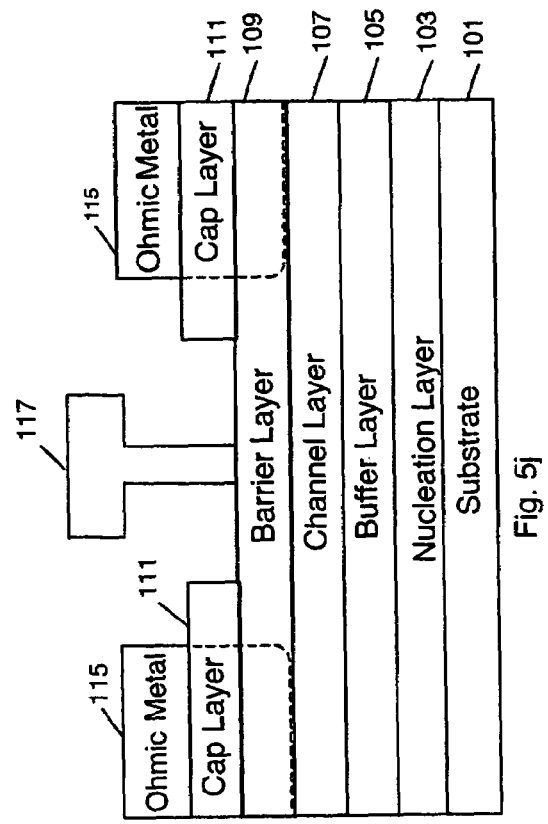

GAN DHFET

CROSS REFERENCE TO RELATED APPLICATION

This application claims the benefit of U.S. Provisional Patent Application No. 60/475,545 filed Jun. 2, 2003, the disclosure of which is hereby incorporated herein by reference.

FIELD

The present invention relates to a GaN-based double-heterojunction field-effect transistor (DHFET) with improved performance characteristics. More specifically, the present invention relates to a GaN-based HFET comprising a buffer layer containing Al, and a channel layer, wherein the Al content in the buffer layer is related to the thickness of the channel layer.

BACKGROUND

Heterojunction field-effect transistors (HFETs) are commonly used for applications requiring low noise and high power. These transistors typically contain a channel layer surrounded by a barrier layer and a buffer layer. Generally, there are two types of HFETs: single-heterojunction field-effect transistors (SHFETs) and double-heterojunction field-effect transistors (DHFETs). In SHFETs, the buffer layer and channel layer are comprised of the same material, and the barrier layer is comprised of a different material. The channel/barrier interface is the single heterojunction in this structure. In DHFETs the buffer layer and barrier layer are comprised of different materials than the channel layer. Thus, the buffer/channel and channel/barrier interfaces are both heterojunctions. The key feature of a HFET is that the channel/barrier heterojunction induces a highly conductive, two-dimensional electron gas (2DEG) in the channel near the interface.

Shown in FIG. 1 is a typical structure for a HFET. The HFET comprises a substrate 1, and a nucleation layer 3. The substrate 1 typically comprises GaN, AlGaN, SiC, diamond, sapphire, AlN, BN, or LiGaO$_2$. A buffer layer 5 is located on the nucleation layer 3 followed by a channel layer 7 and then a barrier layer 9. The nucleation layer 3 provides a crystallographic transition between the substrate 1 and the buffer layer 5, which may have different crystal structures. The channel layer 7 allows electrons in the channel to flow between the ohmic metal contacts 13, which typically act as the source and drain of the HFET.

The barrier layer 9 induces a highly conductive, two-dimensional electron gas (2DEG) in the channel layer 7 near the interface with the barrier layer 9 and also acts as an insulator between the gate 15 and the channel layer 7. When electrons "spill" from the channel layer 7 into the buffer layer 5, the performance of the transistor is reduced; thus, confinement of electrons in the channel layer 7 is highly desirable. The barrier layer 9 is located on the channel layer 7. A cap layer 11 is also provided on a portion of the barrier layer 9. The cap layer 11 helps prevent oxide and other impurities from damaging the barrier layer 9 during processing. Ohmic metal contacts 13 are also provided. The ohmic contacts 13 are annealed at a high temperature such that they diffuse into the cap layer 11 and barrier layer 9, where they contact the channel layer 7.

The following will describe some typical HFETs making reference to the above description and the HFET structure shown in FIG. 1. GaN-based single-heterojunction field-effect transistors (SHFET) are commonly used in the design of GaN HFETs. In a GaN-based SHFET the nucleation layer 3 comprises AlN or AlGaN. The buffer layer 5 comprises GaN, the channel layer 7 comprises GaN, and the barrier layer 9 comprises AlGaN. FIG. 2 is a band-edge diagram depicting the conduction band of a GaN-based SHFET where the buffer layer 5 comprises GaN, the channel layer 7 comprises GaN and the barrier layer 9 comprises $Al_{0.28}Ga_{0.72}N$. Because the bandgap of AlGaN is larger than that of GaN, there is a band-edge discontinuity at the interface between the barrier layer 9 and channel layer 7. The nature of this discontinuity is such that a potential energy well for electrons is formed in the channel layer 7 near the barrier layer 9. Electrons are confined to the channel layer 7 and a 2DEG is formed. It is important to note that because AlGaN and GaN have different lattice parameters, the interface between these materials is strained. This strain results in positive polarization charges at the channel layer 7 and barrier layer 9 interface. These charges intensify the sharp band-edge discontinuity at the interface between the barrier layer 9 and channel layer 7, further confining electrons to the 2DEG. However, the interface between the channel layer 7 and buffer layer 5 is not a heterointerface; thus there are no differences in bandgap or positive polarization charges and the conduction band is continuous. As a result, it is easy for so-called "hot electrons" to spill into the buffer layer 5 from the channel layer 7. "Hot electrons" are electrons that have sufficient energy to escape the attractive pull of the potential energy well at the interface between the channel layer 7 and barrier layer 9. They are typically present in high-electric field regions of the channel layer 7. The hot electron effect occurs because electron energy-relaxation time is typically significantly longer than their momentum relaxation time. These electrons have sufficient energy to move into another region, such as the buffer layer 5, ultimately degrading the performance of the SHFET.

The confinement of the 2DEG in the channel layer 7 can be improved by using a double-heterojunction structure in which the buffer layer 5 comprises a material having a wider bandgap than that of the channel layer 7. For example, in InP-based HFETs (so called because the device layers are grown on InP substrates), double-heterojunction field effect transistors (DHFETs) have been utilized. DHFETs are also discussed in U.S. Pat. No. 4,827,320 and in Loi. D. Nguyen et al., IEEE *Transaction on Electron Devices*, vol. 39, pp 2007–2014 (1992). A band-edge diagram of an InP-based DHFET where the buffer layer 5 comprises $Al_{0.48}In_{0.52}As$, the channel layer 7 comprises $In_{0.53}Ga_{0.47}As$ and the barrier layer 9 comprises $Al_{0.48}In_{0.52}As$ is shown in FIG. 3. As can be seen, the sharp band-edge discontinuities which exist at the interface between the barrier layer 9 and channel layer 7, as well as at the interface between the channel layer 7 and buffer layer 5, help confine the 2DEG to the channel layer 7. Similar results have also been attainable using other wide-gap materials such as GaAs and narrower-gap materials such as InAs. However, InP-, GaAs- and InAs-based materials do not provide the advantages of using GaN-based materials. For example, GaN-based materials have much larger bandgaps than InP-, GaAs-, or InAs-based transistors which allow a higher voltage to be applied to the transistor before entering breakdown.

Designs for DHFETs implemented in GaN-based materials have mimicked designs for DHFETs implemented in InP-, GaAs-, and InAs-based materials. One attempt at demonstrating such an analogous device is discussed in N. Maeda et al., *physica status solidi* (b) pp. 727–731 (1999).

Shown in FIG. 4 is a band-edge diagram of a GaN-based DHFET. The buffer layer 5 comprises $Al_{0.095}Ga_{0.905}N$, the channel layer 7 comprises GaN and the channel layer 9 comprises $Al_{0.28}Ga_{0.72}N$. In general though, the buffer layer 5 comprises $Al_xGa_{1-x}N$, the channel layer 7 comprises GaN, and the barrier layer 9 comprises AlGaN, where x is typically in the range of 15%<x<50%. Such a structure is discussed in U.S. Pat. 5,929,467. This Al concentration yields an AlGaN alloy with a bandgap much larger than that of the GaN of the channel layer 7 (just as the bandgap of the $Al_{0.48}In_{0.52}As$ buffer layer is much larger than that of the $In_{0.53}Ga_{0.47}As$ channel layer in InP-based DHFETs). However, such attempts to mimic the 2DEG confinement in GaN, in a manner similar InP-, GaAs- and InAs-DHFETs have proven unsuccessful.

These GaN DHFETs contain large polarization charges at the interface between the buffer layer 5 and channel layer 7. These charges result in exceptionally large electric fields at that interface which cause the valence band edge on the channel layer 7 side to rise above the Fermi level at the interface, as shown in FIG. 4. As a result, a two-dimensional hole gas (2DHG) forms at the interface of the channel layer 7 and buffer layer 5. The 2DHG increases the capacitance of the DHFET, which reduces the performance of the transistor. Furthermore, the 2DHG is poorly controlled by the voltage at the gate 15, and because hole mobility is significantly lower than electron mobility, the frequency response of the DHFET is significantly limited.

As a result, there is a need for a HFET that provides the bandgap characteristics of GaN-based HFETs, confines the 2DEG to the channel layer, and reduces the 2DHG.

SUMMARY

In order to achieve the need outlined above, and according to one aspect of this invention, there is provided a DHFET having a channel layer comprising GaN and a buffer layer comprising $Al_xGa_{1-x}N$, where the Al content (i.e. x) is varied depending on the thickness of the channel layer. The Al content in the buffer layer is significantly lower than the previously thought optimal value. Reducing the Al content used in the buffer layer also helps cause a misalignment between the conduction band and valence band associated with the channel layer and buffer layer, which helps to reduce the 2DHG, thereby enhancing the performance of the transistor.

BRIEF DESCRIPTION OF THE DRAWINGS

FIGS. 5a–5j depict the fabrication of the DHFET of the present invention.

DETAILED DESCRIPTION OF THE PREFERRED EMBODIMENTS

Figure 1:
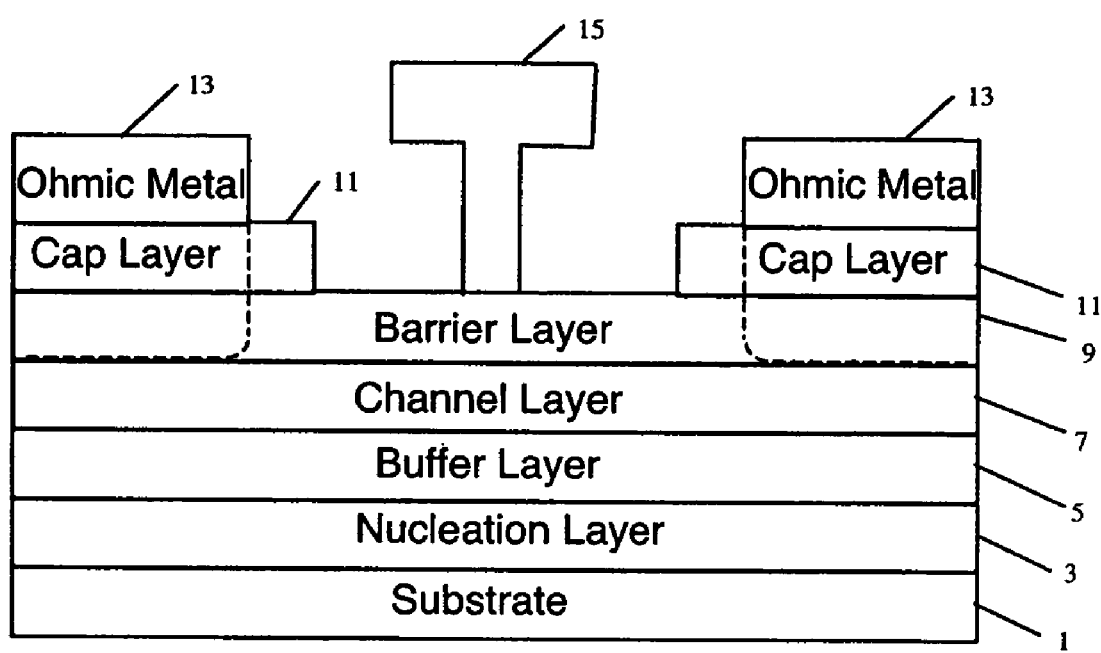
FIG. 1 shows a HFET according to the prior art.

The present invention will now be described more fully hereinafter with reference to the accompanying drawings, in which preferred embodiments of the invention are shown. This invention may be embodied in many different forms and should not be construed as limited to the embodiments set forth herein.

A preferred embodiment of the present invention will now be described with reference to FIGS. 5a–5j and 6–8, where a GaN based DHFET having a substrate 101, nucleation layer 103, buffer layer 105, channel layer 107, barrier layer 109, and cap layer 111 is described. These layers can be made and deposited, for example, using molecular beam epitaxy (MBE) technologies. The substrate 101, shown in FIG. 5a, may comprise GaN, AlGaN, SiC, diamond, sapphire, AlN, BN, or $LiGaO_2$. A nucleation layer 103 is preferably deposited on the substrate 101, as shown in FIG. 5b, and typically has a thickness in the range of 10–50 nm. The nucleation layer 103 comprises AlN or AlGaN and preferably has a <0001> crystal structure. A buffer layer 105, shown in FIG. 5c, is deposited on the nucleation layer 103, if used, or directly on the substrate 101. The buffer layer 105 preferably comprises $Al_xGa_{1-x}N$. The crystal structure of the nucleation layer 103, if used, is provided so as to be able to form strong bonds with the substrate 101 and buffer layer 105. A channel layer 107 is deposited on the buffer layer 105, as shown in FIG. 5d. The channel layer 107 preferably comprises GaN, however InGaN can work equally as well. Also, the channel layer 107 preferably has a sheet charge (Ns) of $1\times10^{-13}$ $cm^{-2}$.

The buffer layer 105 helps prevent the 2DEG in the channel layer 107 from spilling into the substrate 101 and the nucleation layer 103. The Al content (i.e. x) in the $Al_xGa_{1-x}N$ buffer layer 105 is directly dependent on the thickness of the channel layer 107, and will be discussed later. A barrier layer 109 is deposited on the channel layer 107, as shown in FIG. 5e, to provide electrons to the channel 107. The barrier layer 109 also acts as an insulator between a subsequently deposited gate and the channel layer 107, and preferably comprises six sublayers, sequentially deposited on top of each other, as shown in FIG. 5f, having the following compositions:

First sublayer 109a: 2 nm–10 nm thick layer of undoped $Al_{0.3}Ga_{0.7}N$;

Second sublayer 109b: $2\times10^{12}$ $cm^{12}$ total sheet charge (planar or delta) doped $Al_{0.3}Ga_{0.7}N$ layer of a molecular layer to several molecular layers;

Third sublayer 109c: 10 nm–28 nm thick layer of undoped $Al_{0.3}Ga_{0.7}N$;

Fourth sublayer 109d: 10 nm thick, $1\times10^{19}$ $cm^{-3}$ doped $Al_{0.3}Ga_{0.7}N$ layer;

Fifth sublayer 109e: $2\times10^{13}$ $cm^{-2}$ total sheet charge (planar or delta) doped $Al_{0.3}Ga_{0.7}N$ layer; and Sixth sublayer 109f: 10 nm–30 nm thick compositionally graded $Al_xGa_{1-x}N$ layer, wherein 0<x<0.3.

Figure 4:
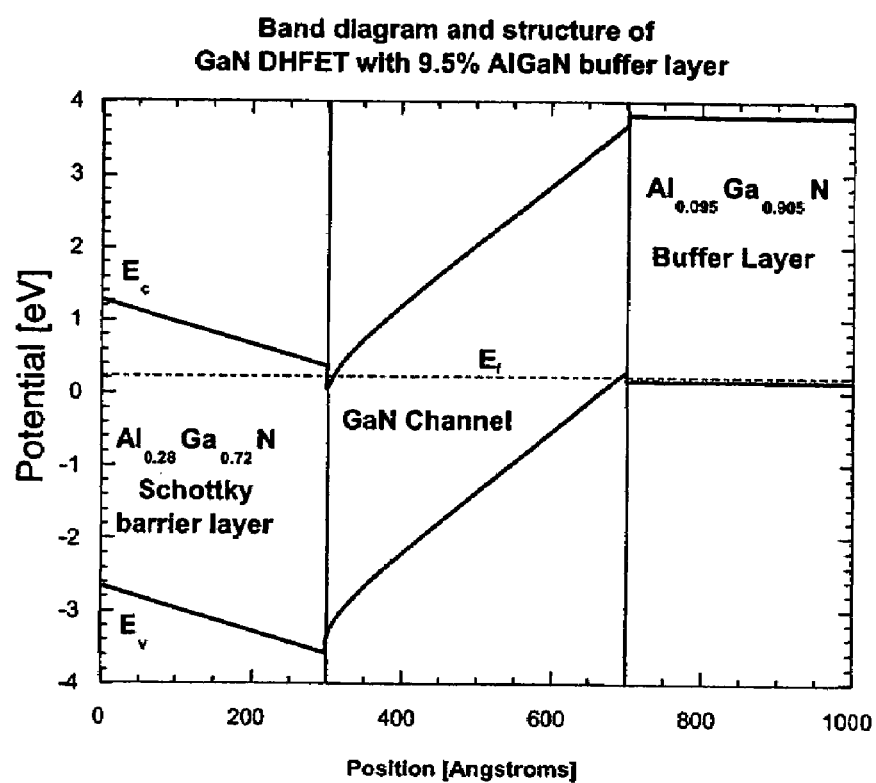
FIG. 4 shows a band diagram of a GaN-based DHFET according to the prior art.

In order to calculate the optimal value of x for a given channel layer 107 thickness, a one-dimensional model for calculating GaN DHFET band diagrams that accounts for polarization charges at heterojunction interfaces was developed. The model is used to calculate the band diagram of the DHFET by numerically solving a set of coupled Poisson and Schrödinger equations using AlGaN material parameters taken from O. Ambacher et al., *Journal of Applied Physics* 85, pp. 3222–3233 (1999). Using the model to analyze the failure of conventional GaN DHFET structures, it was found that the high Al content used for the barrier and buffer layers in conventional GaN DHFET's resulted in a band structure similar to the one shown in FIG. 4 that fundamentally limits device performance.

Figure 6:
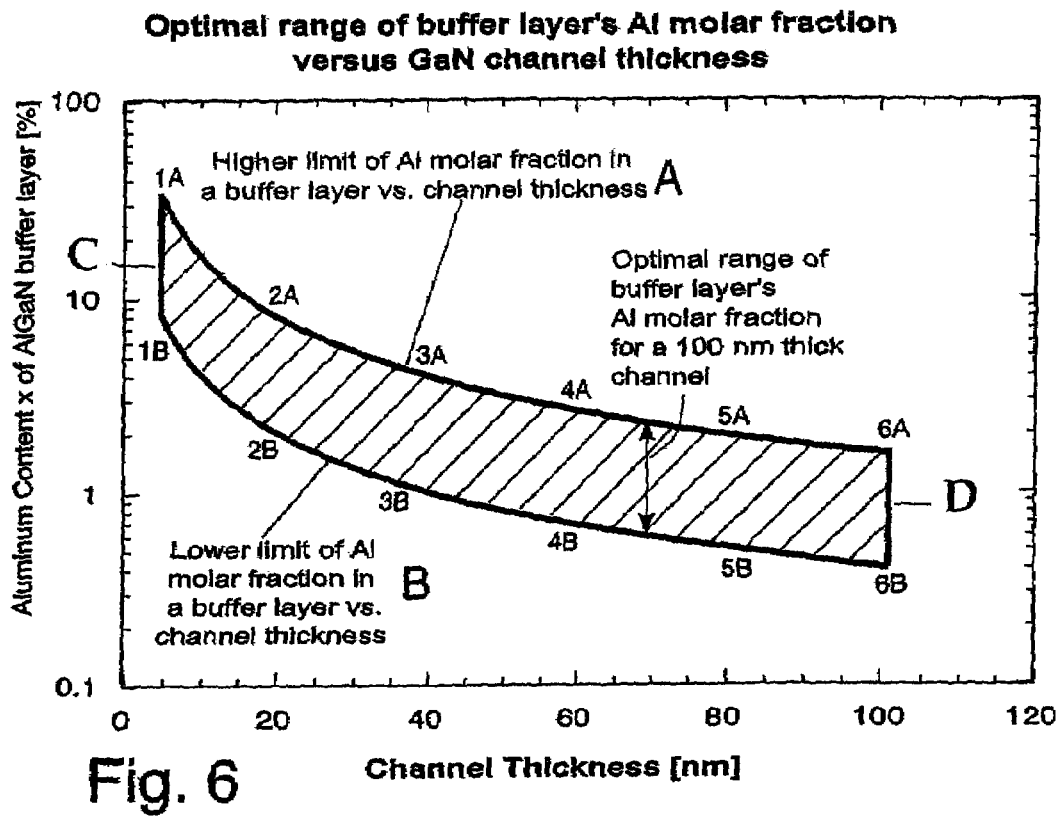
FIG. 6 shows a graph of the relation between the Al content in the buffer layer against the channel layer thickness.

Using this model, a more optimal value of x (that is, the aluminum mole fraction in the buffer layer 105) versus the thickness of the channel layer 107, was calculated and will now be discussed with reference to FIGS. 6 and 7. FIG. 6 depicts a hatched region defined by curve A, curve B, line C, and line D. Curve A is the upper limit of x vs. the channel layer 107 thickness and curve B is the lower limit of x vs. the channel layer 107 thickness. Curves A and B are comprised of a plurality of points, of which several are represented by Table 1 and shown in FIG. 6. For practical depiction only, those portions of curves A and B defined for channel layer 107 thicknesses between 5 nm and 100 nm are represented in Table 1 and shown in FIG. 6.

TABLE 1

| POINTS | X (%) | THICKNESS (nm) |
|---|---|---|
| 1A | 32 | 5 |
| 2A | 8.5 | 20 |
| 3A | 4 | 40 |
| 4A | 2.8 | 60 |
| 5A | 2 | 80 |
| 6A | 1.6 | 100 |
| 1B | 8 | 5 |
| 2B | 2 | 20 |
| 3B | 1 | 40 |
| 4B | 0.65 | 60 |
| 5B | 0.52 | 80 |
| 6B | 0.39 | 100 |

From Table 1 and graph 6, the shaded region can be defined as the region contained by curve A, curve B, line C, and line D, wherein:

(A) curve A is a curve for smoothly connecting six points of 1A (the upper value of x for a channel layer thickness of 5 nm), 2A (the upper value of x for a channel layer thickness of 20 nm), 3A (the upper value of x for a channel layer thickness of 40 nm), 4A (the upper value of x for a channel layer thickness of 60 nm), 5A (the upper value of x for a channel layer thickness of 80 nm), 6A (the upper value of x for a channel layer thickness of 100 nm);

(B) curve B is a curve for smoothly connecting six points of 1B (the lower value of x for a channel layer thickness of 5 nm), 2B (the lower value of x for a channel layer thickness of 20 nm), 3B (the lower value of x for a channel layer thickness of 40 nm), 4B (the lower value of x for a channel layer thickness of 60 nm), 5B (the lower value of x for a channel layer thickness of 80 nm), 6B (the lower value of x for a channel layer thickness of 100 nm);

(C) line C is specified by a channel layer thickness of 5 nm; and (D) line D is specified by a channel layer 107 thickness of 100 nm.

The thickness of the channel layer 107 generally does not fall below 5 nm because the energy of the ground state of the 2DEG increases rapidly as the channel layer 107 thickness is reduced below this value. In the limit of an infinitely thin channel layer 107, the ground state rises to the top of the channel layer 107, electrons are no longer confined to the channel layer 107, and the 2DEG ceases to exist.

Figure 2:
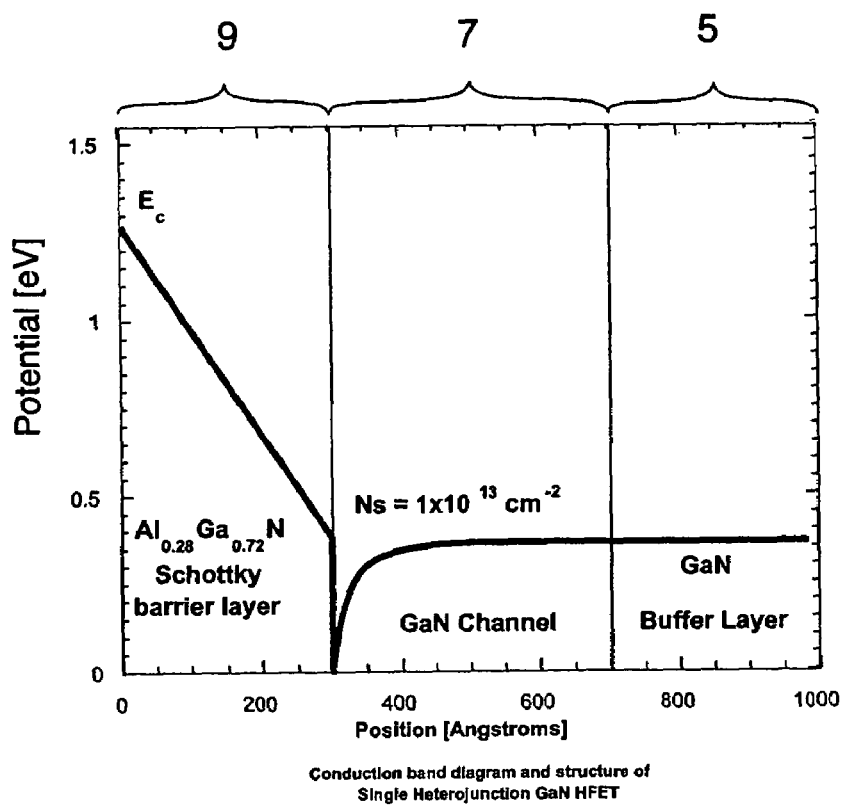
FIG. 2 shows a band diagram of a GaN-based SHFET according to the prior art.
Figure 3:
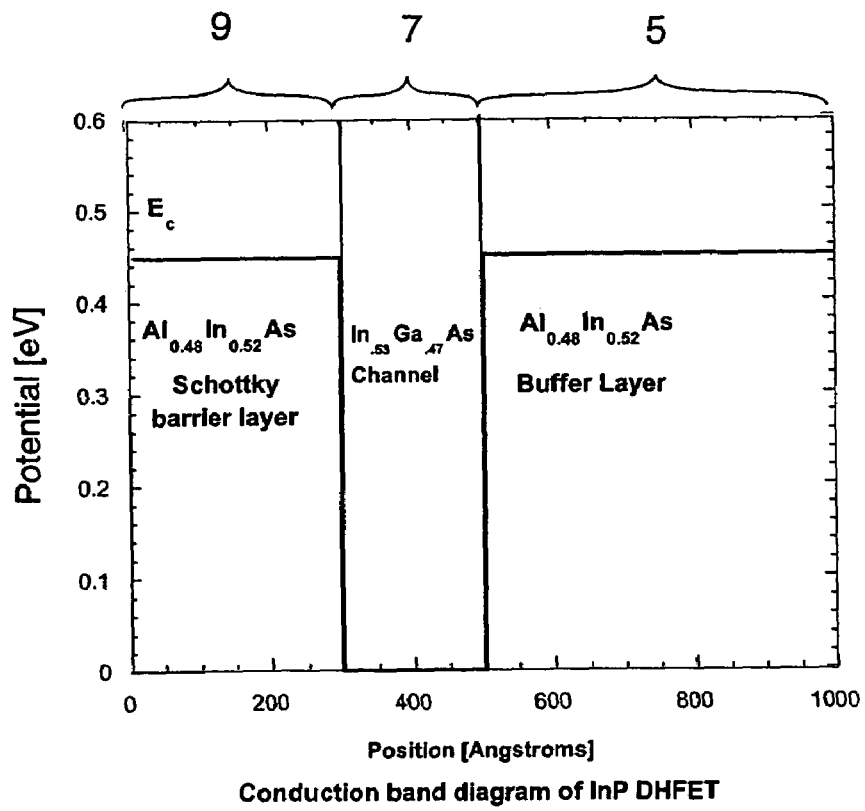
FIG. 3 shows a band diagram of an InP-based DHFET according to the prior art.
Figure 7:
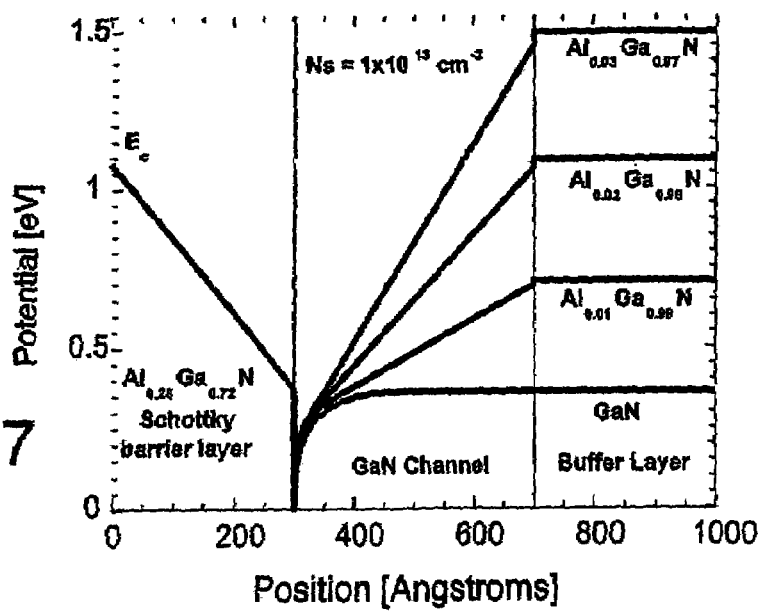
FIG. 7 shows the band diagram of the DHFET according to the present invention.

For purposes of comparison, FIG. 7 shows a calculated band-edge diagram using the aforementioned model. FIG. 7 is similar to the band-edge diagram for the GaN-based SHFET shown in FIG. 2. However, the band-edge diagram of FIG. 7 further includes three conduction bands for a GaN-based DHFET according to the present invention using three different values for the Al content in the buffer layer 107. The three conduction bands show Al contents (x) of 1%, 2%, and 3%, for a channel layer 107 having a thickness of 40 nm. At the first interface 106 between the buffer layer 105 and the channel layer 107, there is a discontinuity in the conduction band. More specifically, the portion of the conduction band defined by the buffer layer 105 at the first interface 106 is at a greater potential than the portion of the conduction band defined by the channel layer 107 at the first interface 106. It is this discontinuity and the gradient in potential energy throughout the channel layer 107 that helps confine the 2DEG to the channel layer 107. Similarly at the second interface 108 located between the channel layer 107 and the barrier layer 109, a discontinuity in the conduction band exists. More specifically, the portion of the conduction band defined by the barrier layer 109 at the second interface 108 is at a higher potential than the portion of the conduction band defined by the channel layer 107 at the second interface 108.

Figure 8:
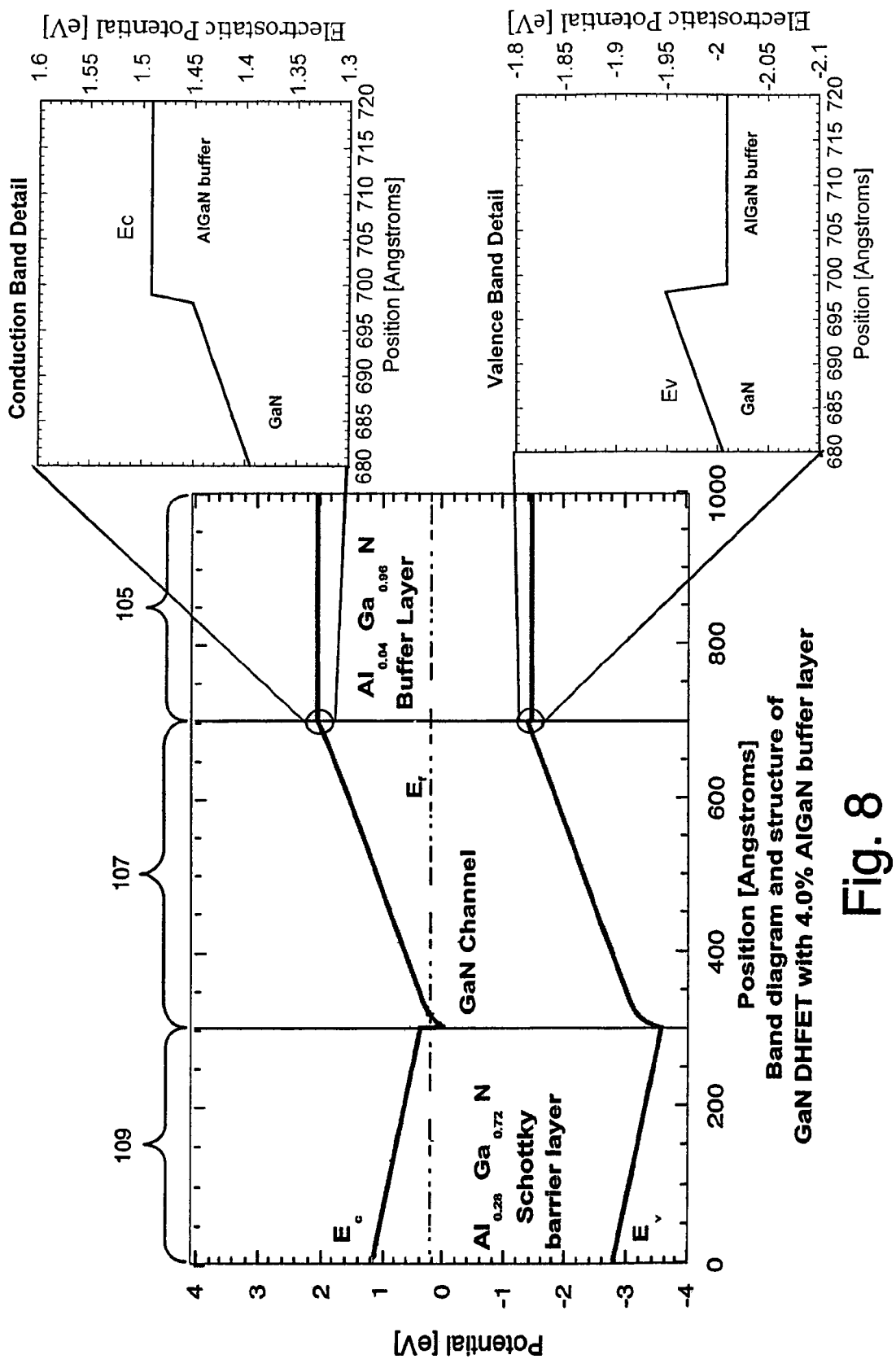
FIG. 8 shows the band diagram of the DHFET according to the present invention.

FIG. 8 is another calculated band-edge diagram of a GaN-based DHFET with a channel layer thickness and Al content chosen in accordance with the present invention. As can be seen, the channel layer 107 has a thickness of 400 Å and the Al content of the $Al_xGa_{1-x}N$ in the buffer layer is 4%. Also, the barrier layer comprises $Al_{0.28}Ga_{0.72}N$. The conduction band is discontinuous at the interface between the buffer layer and channel layer, and the portion of the conduction band in the buffer layer at the first interface is at a greater potential than the portion of the conduction band in the channel layer at the first interface. In addition, the valence band defined in the channel layer 107 and buffer layer 105 at the first interface does not cross the Fermi level at the first interface which helps suppress a 2DHG from forming.

Figure 9:
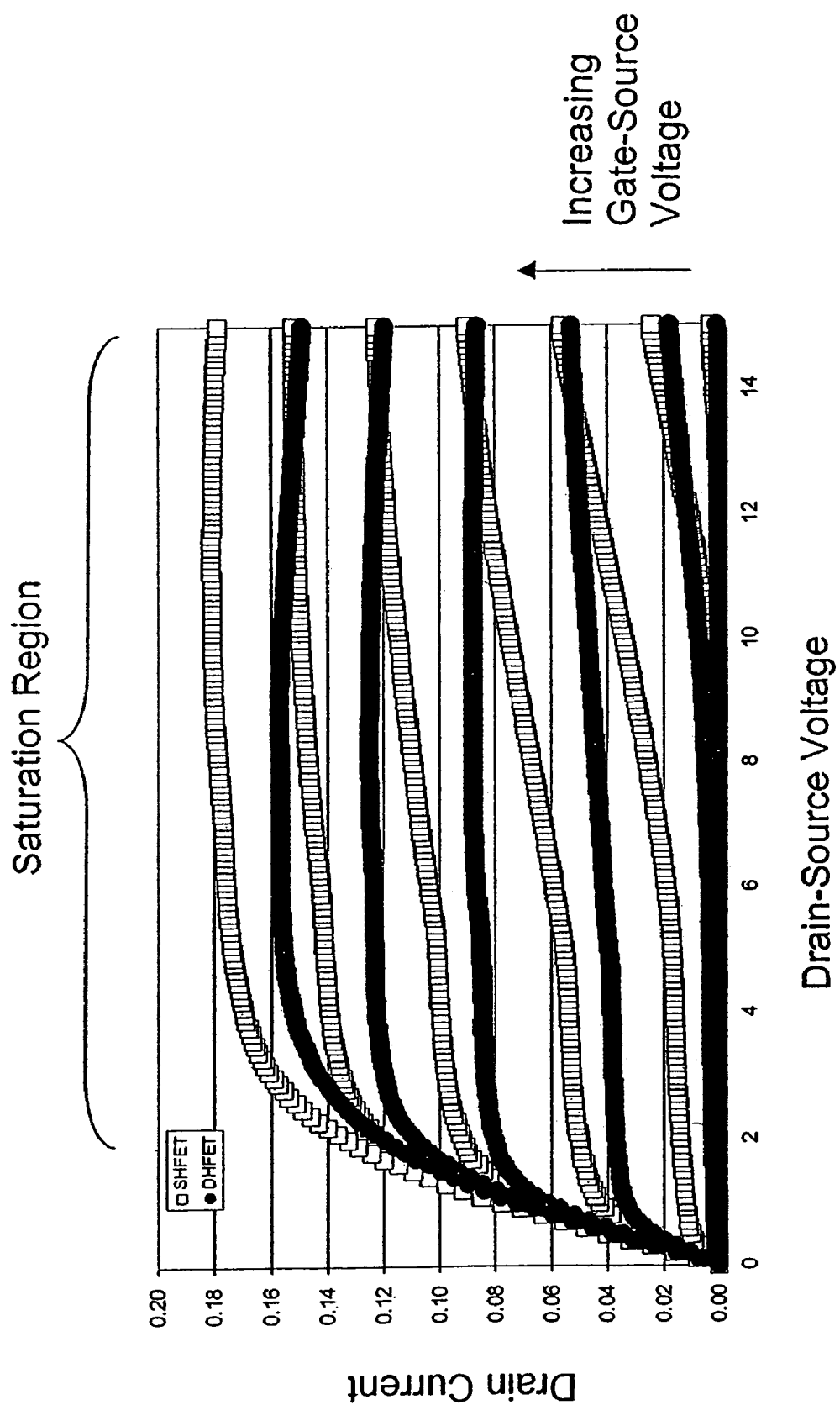
FIG. 9 shows the I–V curve of a GaN DHFET fabricated according to the present invention.

Shown in FIG. 9 is an experimental I–V curve of a GaN DHFET and a GaN SHFET for increasing gate-source voltages, fabricated according to the present invention. In the graph, the GaN DHFET has a channel layer with a thickness of 40 nm, and a buffer layer with a composition of $Al_{0.02}Ga_{0.98}N$. The x-axis represents the drain-source voltage (in volts), and the y-axis represents the drain current (in Amps). The DHFET is depicted by the dark circles and the SHFET is depicted by the light squares. As can be seen in the graph, in the saturation region the I-V curve of the DHFET is substantially flat, while the I–V curve for the SHFET has a slight incline. As a result, the output conductance (i.e. the ratio of the change in drain current over the change in drain-source voltage) will be lower for the GaN DHFET than for the SHFET. This is due to improved confinement of hot electrons in the channel layer of the GaN DHFET.

Referring back to FIG. 5g, after the deposition of the barrier layer 109, a cap layer 111 preferably comprising GaN is deposited. The cap layer 111 helps prevent the surface of the barrier layer 109 from being damaged by oxide or other impurities. The cap layer 111 may also be heavily doped to facilitate the fabrication of ohmic contacts (discussed below). After the cap layer 111 is deposited, a layer of photoresist 113 is deposited, as shown in FIG. 5h. A portion of the photoresist 113 is patterned and removed using UV lithography. Ohmic metal contacts 115 are deposited in the region where the photoresist is removed. The remaining photoresist is removed by soaking the DHFET in a photoresist stripper for about 1 hour at about 100° C. and rinsing in DI water. The ohmic contacts are annealed at a temperature between about 600° C. and 900° C. in a nitrogen ambient for about 30 seconds, as shown in FIG. 5i. Annealing the ohmic metal contacts 115 allows them to diffuse into the structure such that they contact the channel layer 107. The ohmic metal contacts 115 may be deposited using any commercially available e-beam evaporator or similar device and can be used as the source and drain of the HFET. The ohmic metal contacts 115 preferably comprise a 20 nm layer of Ti, a 200 nm layer of Al, and another 100 nm layer of Pt, deposited in that order. Optionally, after depositing the ohmic metal contacts 115, a layer of SiN about 50 nm thick may be deposited on a portion of the ohmic metal contacts 115 to prevent the ohmic metal contacts 115 from moving during the annealing step. This optional step is the subject matter of U.S. Ser. No. 60/401,414. If a plurality of HFET's are being fabricated on a wafer, they can now be separated using either ion implantation or mesa etching.

Next, an opening for a gate is created. Using the ohmic contacts 115 or the optional SiN layer as a mask, a portion of the cap layer 111 is removed preferably using a reactive ion etch with a chlorine gas, or a wet chemical etch. A gate 119 preferably having a T-shaped structure is then deposited using bi-layer e-beam lithography on the barrier layer 109, as shown in FIG. 5j. The gate 119 preferably comprises a 20 nm layer of Pt, a 20 nm layer of Ti, and a 310 nm layer of Au, deposited in that order. However, other metal combinations such as Ni/Au, Pt/Ti/Au, W/Ti/Au, W/Al, W/Ti/Au, W/Si/Al, W/Si/Ti/Au can be used equally as well. The gate 119 is passivated by surrounding the sides of the gate 119 (not the gate surface) and the exposed part of the barrier layer 109 with a dielectric such as silicon dioxide or silicon nitride.

Let it be understood that the foregoing description is only illustrative of the invention. Various alternatives and modifications can be devised by those skilled in the art without departing from the spirit of the invention. Accordingly, the present invention is intended to embrace all such alternatives, modifications, and variances which fall within the scope of the appended claims.

What is claimed is:

1. A heterostructure semiconductor device having:
    a buffer layer comprising $Al_xG_{1-x}N$, where x is in the range of 1% to 4%; and
    a channel layer disposed on the buffer layer, thereby defining a first interface located between the buffer layer and the channel layer, the channel layer comprising GaN, and having a thickness in the range of 40–100 nm.

2. The heterostructure semiconductor device of claim 1, wherein the buffer layer and the channel layer each define a portion of a conduction band, the conduction band being discontinuous at the first interface.

3. The heterostructure semiconductor device of claim 2, further comprising a barrier layer disposed over the channel layer, wherein a second interface is defined between the barrier layer and the channel layer, and wherein the barrier layer defines a portion of the conduction band, the conduction band being discontinuous at the second interface.

4. The heterostructure semiconductor device of claim 2, wherein the portion of the conduction band defined by the buffer layer at the first interface is at a greater potential than the portion of the conduction band defined by the channel layer at the first interface.

5. The heterostructure semiconductor device of claim 3, wherein the portion of the conduction band defined by the barrier layer at the second interface is at a greater potential than the portion of the conduction band defined by the channel layer at the second interface.

6. The heterostructure semiconductor device of claim 1, wherein the buffer layer and channel layer each define a portion of a valence band and a portion of a Fermi level, wherein the portion of the valence band defined by the buffer layer at the first interface and the portion of the valence band defined by the channel layer at the first interface are at a potential lower than the Fermi level at the first interface.

7. A heterostructure semiconductor device comprising:
    a buffer layer comprising $Al_xGa_{1-x}N$; and
    a channel layer disposed on the buffer layer, thereby defining a first interface located between the buffer layer and channel layer, the channel layer comprising GaN; wherein the value of x falls within a range contained between a curve A, a curve B, a line C, and a line D in a graph showing a relation between the value of x and the thickness of the channel layer, wherein:
    the curve A smoothly connects six points of an upper x value of 10% at the channel layer thickness of 15 nm, an upper x value of 8.5% for the channel layer thickness of 20 nm, an upper x value of 4% for the channel layer thickness of 40 nm, an upper x value of 2.8% for the channel layer thickness of 60 nm, an upper x value of 2% for the channel layer thickness of 80 nm, an upper x value of 1.6% for the channel layer thickness of 100 nm;
    the curve B smoothly connects six points of a lower x value of 2.7% for the channel layer thickness of 15 nm, a lower x value of 2% for the channel layer thickness of 20 nm, a lower x value of 1% for the channel layer thickness of 40 nm, a lower x value of 0.65% for the channel layer thickness of 60 nm, a lower x value of 0.52% for the channel layer thickness of 80 nm, a lower x value of 0.39% for the channel layer thickness of 100 nm;
    the line C is specified by the channel layer thickness of 15 nm; and
    the line D is specified by the channel layer thickness of 100 nm.

8. The heterostructure semiconductor device of claim 7, wherein the buffer layer and the channel layer each define a portion of a conduction band, the conduction band being discontinuous at the first interface.

9. The heterostructure semiconductor device of claim 8, further comprising a barrier layer disposed over the channel layer, wherein a second interface is defined between the barrier layer and the channel layer, and wherein the barrier layer defines a portion of the conduction band, the conduction band being discontinuous at the second interface.

10. The heterostructure semiconductor device of claim 8, wherein the portion of the conduction band defined by the buffer layer at the first interface is at a greater potential than the portion of the conduction band defined by the channel layer at the first interface.

11. The heterostructure semiconductor device of claim 9, wherein the portion of the conduction band defined by the barrier layer at the second interface is at a greater potential than the portion of the conduction band defined by the channel layer at the second interface.

12. The heterostructure semiconductor device of claim 7, wherein the buffer layer and channel layer each define a portion of a valence band and a portion of a Fermi level, wherein the portion of the valence band defined by the buffer layer at the first interface and the portion of the valence band defined by the channel layer at the first interface are at a potential lower than the portion of the Fermi level at the first interface.

13. A heterostructure semiconductor device comprising:
a buffer layer comprising $Al_xGa_{1-x}N$; and
a channel layer disposed on the buffer layer, thereby defining a first interface located between the buffer layer and channel layer, the channel layer comprising GaN;
a barrier layer disposed on the channel layer, thereby defining a second interface located between the barrier layer and the channel layer, the barrier layer comprising AlGaN;
a cap layer disposed on the barrier layer, the cap layer comprising GaN;
ohmic metal contacts deposited on the cap layer, wherein the ohmic metal contacts are in contact with the channel layer;
a gate in contact with the barrier layer;
wherein the value of x and the thickness of the channel layer fall within a range surrounded by a curve A, a curve B, a line C, and a line D in a graph showing a relation between the value of x and the thickness of the channel layer, wherein:
the curve A smoothly connects six points of an upper x value of 10% at the channel layer thickness of 15 nm, an upper x value of 8.5% for the channel layer thickness of 20 nm, an upper x value of 4% for the channel layer thickness of 40 nm, an upper x value of 2.8% for the channel layer thickness of 60 nm, an upper x value of 2% for the channel layer thickness of 80 nm, an upper x value of 1.6% for the channel layer thickness of 100 nm;
the curve B smoothly connects six points of a lower x value of 2.7% for the channel layer thickness of 15 nm, a lower x value of 2% for the channel layer thickness of 20 nm, a lower x value of 1% for the channel layer thickness of 40 nm, a lower x value of 0.65% for the channel layer thickness of 60 nm, a lower x value of 0.52% for the channel layer thickness of 80 nm, a lower x value of 0.39% for the channel layer thickness of 100 nm;
the line C is specified by the channel layer thickness of 15 nm; and
the line D is specified by the channel layer thickness of 100 nm.

14. The heterostructure semiconductor device of claim 13, wherein the buffer layer, the channel layer, and the barrier layer each define a portion of a conduction band, the conduction band being discontinuous at the first interface and the second interface.

15. The heterostructure semiconductor device of claim 14, wherein the portion of the conduction band defined by the buffer layer at the first interface is at a greater potential than the portion of the conduction band defined by the channel layer at the first interface.

16. The heterostructure semiconductor device of claim 14, wherein the portion of the conduction band defined by the barrier layer at the second interface is at a greater potential than the portion of the conduction band defined by the channel layer at the second interface.

17. The heterostructure semiconductor device of claim 13, wherein the buffer layer and channel layer each define a portion of a valence band and a portion of a Fermi level, wherein the portion of the valence band defined by the buffer layer at the first interface and the portion of the valence band defined by the channel layer at the first interface are at a potential lower than the Fermi level at the first interface.

18. The heterostructure semiconductor device of claim 13, wherein at least one between i) the contact between the ohmic metal contacts and the channel layer and ii) the contact between the gate and the barrier layer is an electrical contact.

19. A heterostructure semiconductor device comprising:
a buffer layer; and
a channel layer disposed on the buffer layer, thereby defining a first interface located between the buffer layer and the channel layer, the channel layer comprising a GaN;
wherein the buffer layer and channel layer define a portion of a conduction band, a valence band, and a Fermi level, and wherein the portion of the conduction band defined by the buffer layer at the first interface is at a greater potential than the portion of the conduction band defined by the channel layer at the first interface;
wherein the portion of the conduction band defined by the buffer layer at the first interface and the portion of the conduction band defined by the channel layer at the first interface are at a potential higher than the Fermi level at the first interface; and
wherein the portion of the valence band defined by the buffer layer at the first interface and the portion of the valence band defined by the channel layer at the first interface are at a potential lower than the Fermi level at the first interface.

20. The heterostructure semiconductor device of claim 18, further comprising a barrier layer disposed over the channel layer, wherein a second interface is defined between the barrier layer and the channel layer, and wherein the barrier layer defines a portion of the conduction band, the portion of the conduction band defined by the barrier layer at the second interface being at a greater potential than the portion of the conduction layer defined by the channel layer at the second interface.

* * * * *